US010312435B1

(12) United States Patent
Dobisz et al.

(10) Patent No.: US 10,312,435 B1
(45) Date of Patent: Jun. 4, 2019

(54) METHOD FOR MANUFACTURING HIGH DENSITY MAGNETIC TUNNEL JUNCTION DEVICES USING PHOTOLITHOGRAPHIC VIAS AND CHEMICALLY GUIDED BLOCK COPOLYMER SELF ASSEMBLY

(71) Applicant: Spin Memory, Inc., Fremont, CA (US)

(72) Inventors: Elizabeth A. Dobisz, San Jose, CA (US); Prachi Shrivastava, Newark, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/866,370

(22) Filed: Jan. 9, 2018

(51) Int. Cl.
| | |
|---|---|
| *H01L 43/12* | (2006.01) |
| *H01L 43/02* | (2006.01) |
| *H01L 21/469* | (2006.01) |
| *G11C 11/16* | (2006.01) |
| *H01L 21/027* | (2006.01) |
| *H01L 51/00* | (2006.01) |
| *H01L 21/033* | (2006.01) |
| *H01B 3/44* | (2006.01) |
| *H01L 21/47* | (2006.01) |

(52) U.S. Cl.
CPC ............ *H01L 43/12* (2013.01); *G11C 11/161* (2013.01); *H01B 3/447* (2013.01); *H01B 3/448* (2013.01); *H01L 21/0274* (2013.01); *H01L 21/0337* (2013.01); *H01L 21/0338* (2013.01); *H01L 21/469* (2013.01); *H01L 21/47* (2013.01); *H01L 43/02* (2013.01); *H01L 51/0015* (2013.01); *G11C 2211/5615* (2013.01)

(58) Field of Classification Search
CPC . H01L 43/12; H01L 21/0337; H01L 21/0338; H01L 51/0015; H01L 43/02; H01L 21/469; H01L 21/0274; H01B 3/447; H01B 3/448; G11C 11/161; G11C 2211/5615

See application file for complete search history.

(56) References Cited

U.S. PATENT DOCUMENTS

| | | | | |
|---|---|---|---|---|
| 8,168,449 | B2 * | 5/2012 | Gaidis | B82Y 10/00 257/E21.665 |
| 9,449,840 | B1 * | 9/2016 | Ban | H01L 21/31144 |
| 9,659,790 | B2 * | 5/2017 | Park | H01L 21/31144 |
| 9,666,434 | B2 * | 5/2017 | Kim | H01L 21/0338 |
| 10,101,660 | B2 * | 10/2018 | Park | H01L 27/10844 |
| 2017/0330760 | A1 * | 11/2017 | Singh | H01L 21/0271 |

* cited by examiner

*Primary Examiner* — Bac H Au
(74) *Attorney, Agent, or Firm* — Zilka-Kotab, P.C.

(57) ABSTRACT

A method for manufacturing a magnetic random access memory array at a density greater than would be possible using photolithography. A hard mask material is deposited over a magnetic memory element material, and a chemical template layer such as brush or mat material is deposited over the hard mask. A mask structure is formed over the soluble polymer. The mask structure is configured with openings having a center to center spacing that is an integer multiple of a block copolymer material. The openings in the mask structure can be shrunk by depositing a spacer material. The chemical template layer is chemically patterned, such as by a quick plasma exposure and the mask is removed. A block copolymer material is then deposited over the chemical template and annealed to form block copolymer cylinders that are located over the patterned portions of the chemical template and between the patterned portions.

20 Claims, 22 Drawing Sheets

METHOD FOR MANUFACTURING HIGH DENSITY MAGNETIC TUNNEL JUNCTION DEVICES USING PHOTOLITHOGRAPHIC VIAS AND CHEMICALLY GUIDED BLOCK COPOLYMER SELF ASSEMBLY

FIELD OF THE INVENTION

The present invention relates to magnetic random access memory (MRAM) and more particularly to a method for manufacturing a high density magnetic memory element array.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg-O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin to the electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a method for forming an array of pillars having a density that is greater than that which would be possible using purely photolithographic processes. The method includes depositing a pillar element material such as a magnetic memory element material and then depositing a hard mask layer over the magnetic memory element material. A chemical template material is deposited over the hard mask layer and a soluble polymer is deposited over the chemical template layer. A mask is then formed having openings that are arranged to have a spacing that is substantially an integer multiple of a natural period of a block copolymer material. The size of the openings is then shrunk, such as by depositing a spacer material and then performing an etching to open up the bottom of the spacer material. A plasma exposure is performed to chemically pattern the chemical template layer. A block copolymer material is deposited over the patterned chemical template layer and then annealed to form block copolymer cylinders both in areas over the patterned portions of the chemical template and over regions between the chemical template.

Because the spacing between the patterned portions of the chemical template layer is an integer multiple of the block copolymer material, the block copolymer cylinders form in an ordered pattern having a density greater than the density of the patterned chemical template. These cylinders can then be used as mask structures to pattern the underlying hard mask and then to pattern pillar structures in the pillar element layer.

This process allows very small feature size pillars to be formed at a density that is much greater than what would be possible using photolithography. The patterned chemical template can be used to define cylindrical pillar structures using the block copolymer, at a density that is several times greater than the density of the pattern of the chemical template layer.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
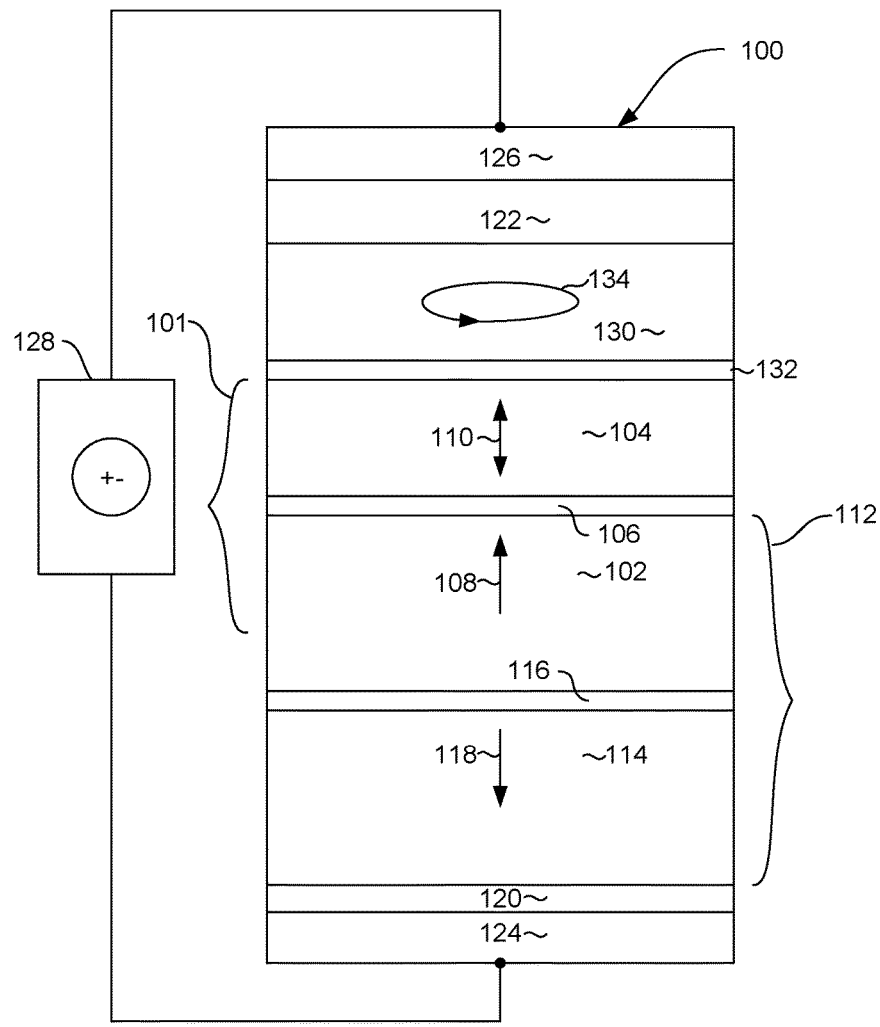
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Au and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
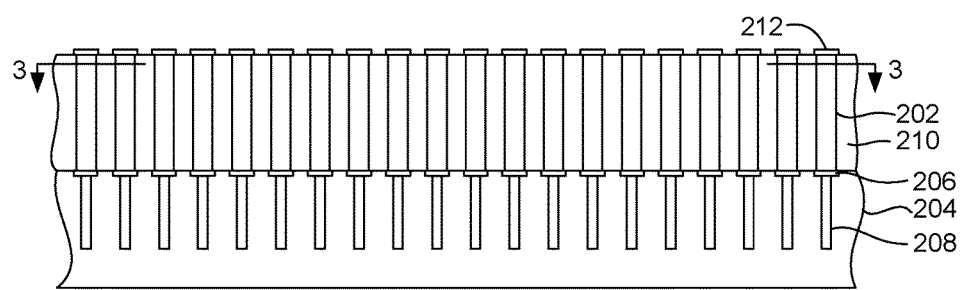
FIG. 2 is a side, cross sectional view of an array of magnetic random access memory elements formed on a substrate.

FIG. 2 shows a side, cross sectional view of an array 200 of magnetic random access memory elements 202 formed on a substrate 204. The substrate 204 can be a semiconductor material such as Si formed from a Si wafer. Each of the magnetic memory elements can be formed on an electrically conductive lead 206 that can connect the magnetic memory element 202 with underlying circuitry such as CMOS circuitry 208 embedded in the substrate 204. The memory elements 202 can be surrounded by an insulating material 210 such as $SiO_2$ or alumina $Al_2O_3$, and electrically conductive upper leads 212.

Figure 3:
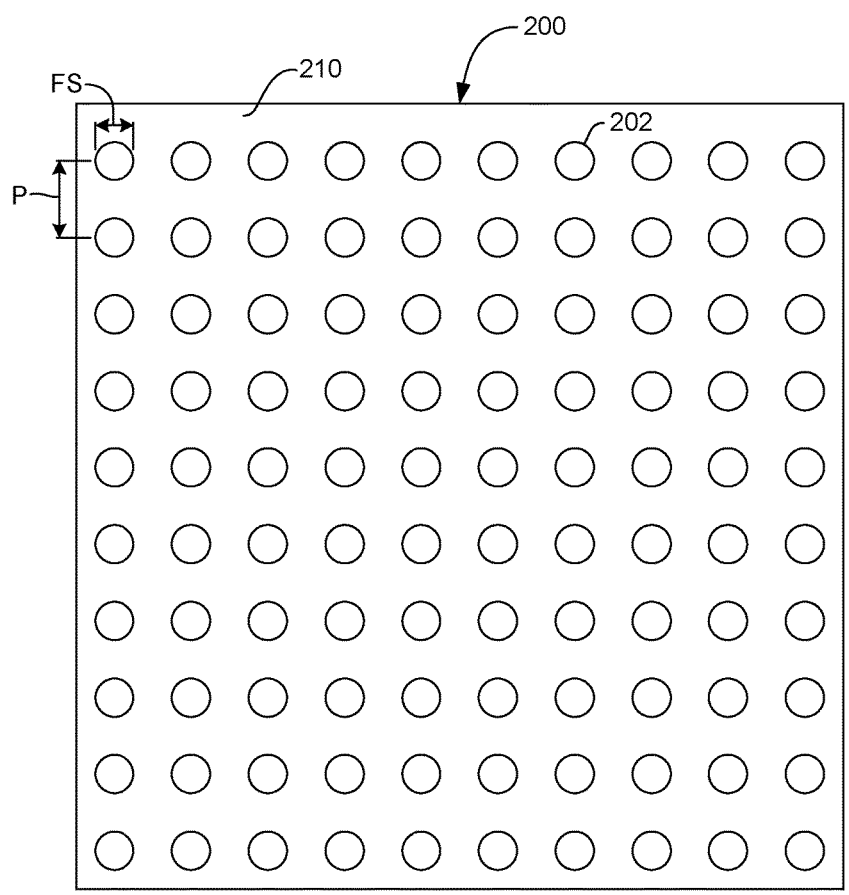
FIG. 3 is a top-down view of the array of magnetic random access memory elements as seen from line 3-3 of FIG. 2.

FIG. 3 shows a top-down, cross-sectional view as seen from line 3-3 of FIG. 2. From, both FIGS. 2 and 3, it can be seen that each of the magnetic memory elements 202 is formed as a cylindrically shaped pillar. In order to increase data density, it becomes necessary increase the number of memory elements 202 in a given area in the array 200. In FIG. 3, it can be seen that the distance between a given location on a memory element 202 to that same location on an adjacent magnetic memory element 202 defines a pitch (P) of the array. This size of each memory element 202 (in this case the diameter of the memory element cylinder) defines the feature size (FS).

With continued reference to FIG. 3, in order to increase data density of a magnetic random access array 200, it is necessary to decrease pitch P and feature size FS. However, processes such as photolithography, which are generally used to define features on a substrate such as a semiconductor wafer, have physical limitations. For example, photolithographic masking and exposure processes are limited by the wavelength of light that can be used to pattern images on the wafer. This has resulted in limits to the amount by which dimensions such as pitch P and features size FS can be reduced and has also correspondingly limited the amount by which data density can be increased.

The present invention overcomes this challenge, allowing features such as magnetic memory elements to be formed at a pitch P and features size FS that are far smaller than the physical limitations of processes such as photolithography.

Figure 4:
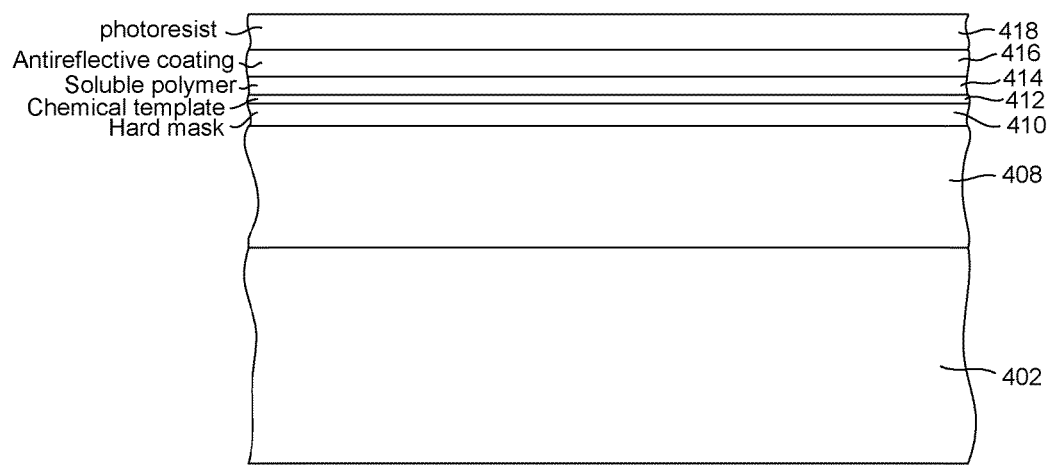
FIGS. 4-21, are views of a wafer in various intermediate stages of manufacture, illustrating a method for manufacturing an array of magnetic random access memory elements.

FIG. 4 shows a side, cross sectional view of a substrate 402 which can be a wafer such as a silicon wafer. The wafer can have electrically conductive lead layers (not shown) formed in its surface, the lead layers being arranged for connection with a magnetic memory pillar formed thereon. The electrically conductive lead layers can be connected with underlying circuitry 406 such as CMOS circuitry (also not shown).

With continued reference to FIG. 4, a layer of magnetic memory element material 408 is deposited over the substrate 402. Although shown in FIG. 4 as a single layer, it should be understood that this material layer 408 actually include various layers used to form a magnetic memory element such as the magnetic memory element 100 of FIG. 1. For example, the layer 408 would include a first and second magnetic layers and a non-magnetic barrier layer located between the first and second magnetic layers, as well as other layer necessary to form a magnetic memory element.

With continued reference to FIG. 4, a hard mask material 410 is deposited over the memory element material 408. The hard mask material 410 can be a material such as carbon or TaN. A brush material 412 is can be deposited over the hard mask 410. The chemical template material 412 can be a brush material such as monomolecular layer grafted to the hard mask 410 or a mat such as a spin on polymer that is cross linked. The chemical template layer 412 can have a surface energy ranging from neutral to preferential to the block copolymer comprising surrounding pillars. It is generally comprised of a single or random mixture of units. For a polystyrene-b-PMMA block copolymer, the brush can be all styrene or a mixture of styrene and methyl methacrylate monomer units. Each monomer unit has a functional group on the end that will bind to the hard mask material 410. Oxygen reactive ion etching (RIE) exposure renders the surface favorable to the cylinder forming block (PMMA).

A layer of soluble polymer material such as DUR-AMIDE® 414 is deposited over the hard brush material 412. The soluble polymer 414 can serve as an anti-reflective coating. An optional additional antireflective coating 416 can be deposited over the soluble polymer material 414. The antireflective coating 416 can be a plurality of layers that can include a bottom antireflective coating (BARC). A layer of photoresist material 418 is then deposited.

Figure 5:
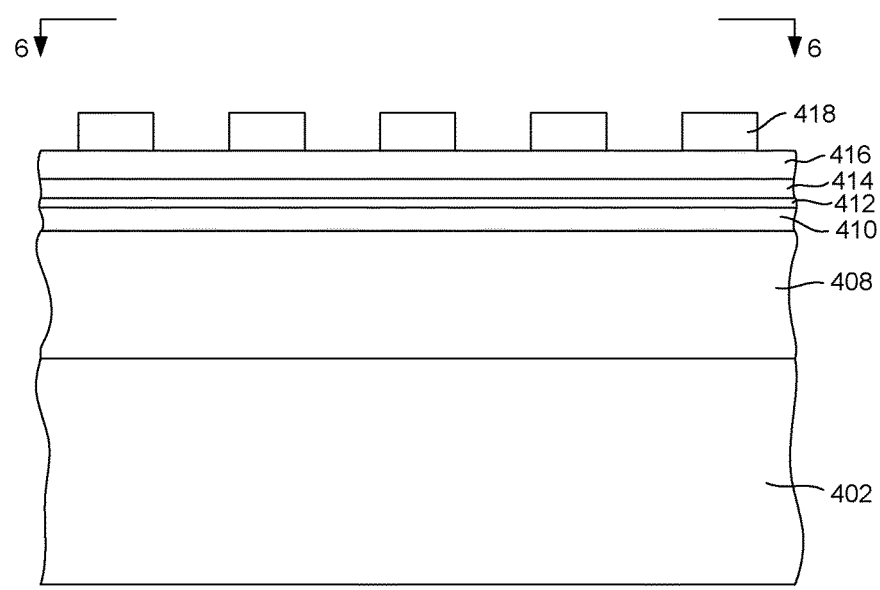
Figure 6:
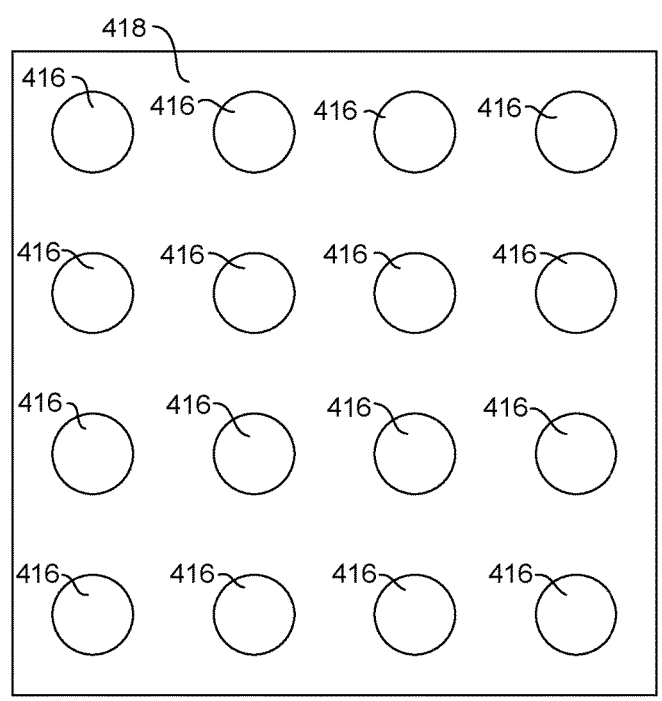
Figure 7:
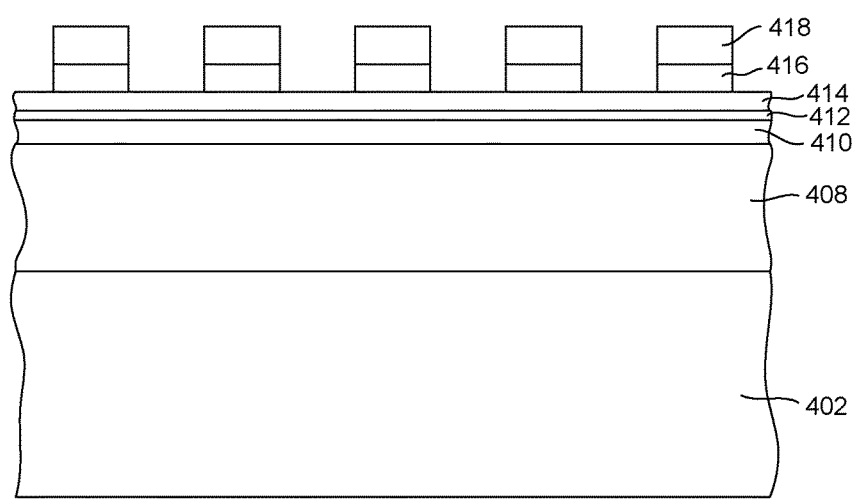

With reference now to FIG. 5, the photoresist material 418 is photolithographically patterned to form a photoresist mask 418 having openings. The openings in the photoresist mask 418 can be better understood with reference to FIG. 6, which shows circular openings in the photoresist layer 418 exposing the underlying layer 416. The photoresist mask 418 is patterned so that the openings have a center to center spacing that is an integer multiple of the natural period of a block copolymer material that will be deposited and processed steps to be further described herein below. With reference now to FIG. 7, an etching process can be performed to transfer the image of the photoresist mask 418 onto the underlying anti-reflective coating 416 if additional anti-reflective coating 416 has been included, the etching being stopped at the soluble polymer 414 as shown in FIG. 7.

Figure 8:
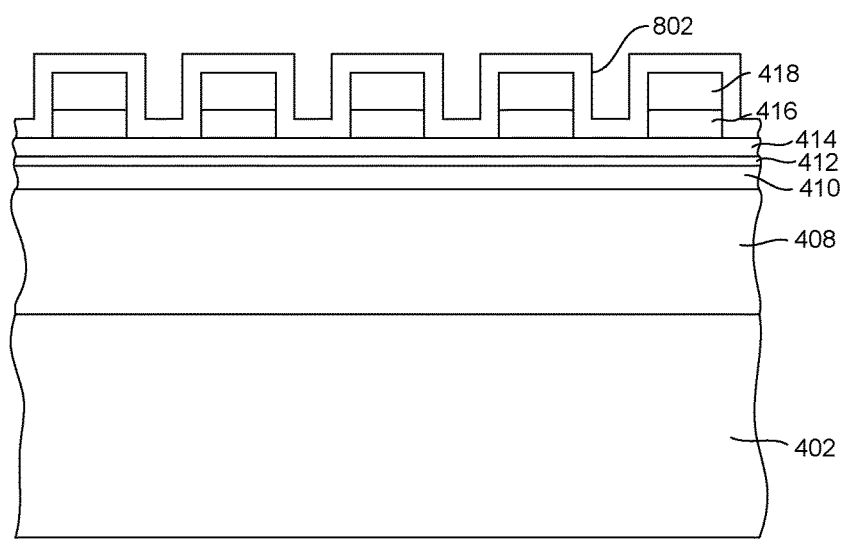
Figure 9:
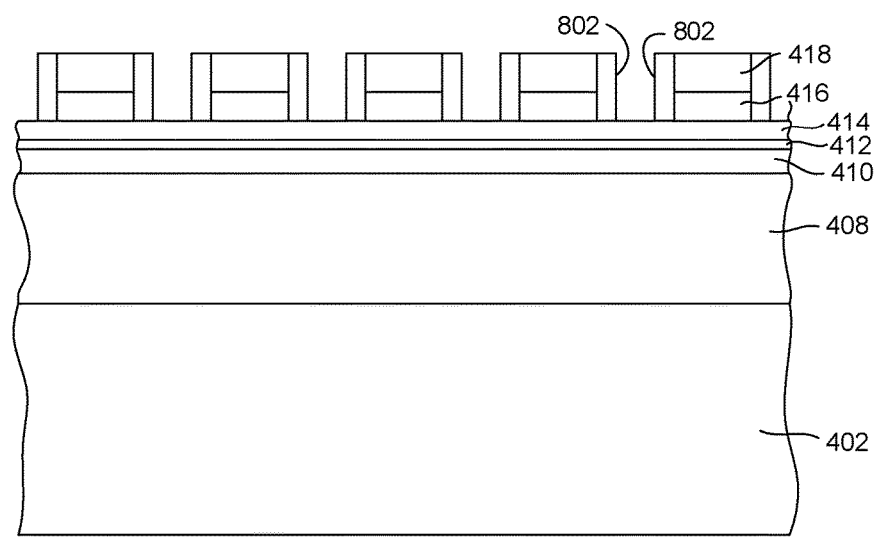

With reference to FIG. 8 a spacer material 802 is deposited. The spacer film 802 can be a material such as SiOx or SiNx and is deposited by a conformal deposition process such as atomic layer deposition (ALD) or chemical vapor deposition (CVD) so that it coats the sides of the patterned photoresist mask 418 and anti-reflective coating 416 (if present). Then, an anisotropic etching process using a fluorine based chemistry such as $HCF_3$ and or $HCF_4$ is performed to open up the spacer material 802 at the base of the via (opening) formed by the patterned photoresist. The use of $HCF_3$ would coat the side walls, thereby further reducing the opening size. This etching process is anisotropic so that it preferentially removes horizontally disposed portions of the spacer material 802 (such as at the top of the photoresist and bottom of the via) at a faster rate than the vertically disposed spacer material 802, thereby forming vertical walls of spacer material 802 as shown in FIG. 9. The etching is an etch back process that removes the spacer material 802 from the top of the photoresist mask 418 between the openings and removes the spacer at the bottom of the openings, where the size of the bottom is reduced by the thickness of the sidewalls. As can be seen, these vertical walls of spacer material 802 shrink the size of the opening (via) that was defined by the photoresist mask 418. The etching process is continued through the soluble polymer 414 stopping at the soluble chemical template layer 412, leaving a structure as shown in FIG. 10.

Figure 10:
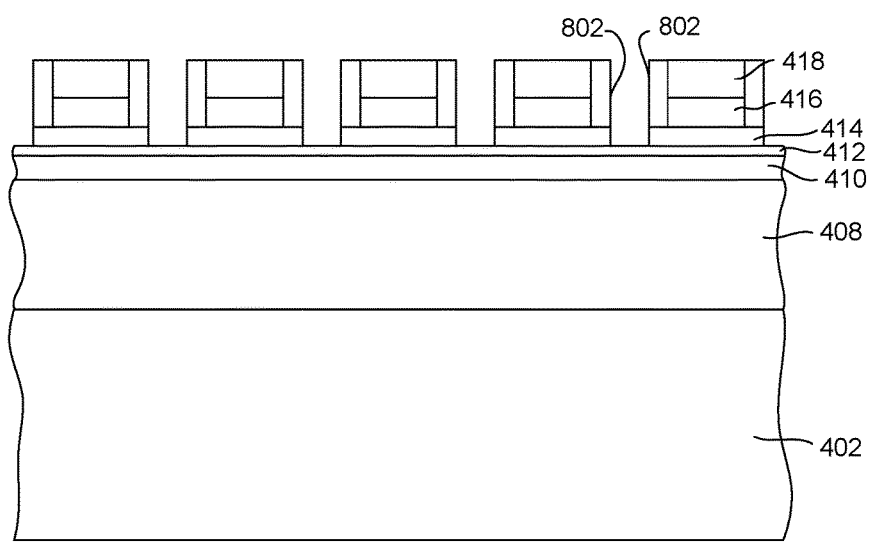
Figure 11:
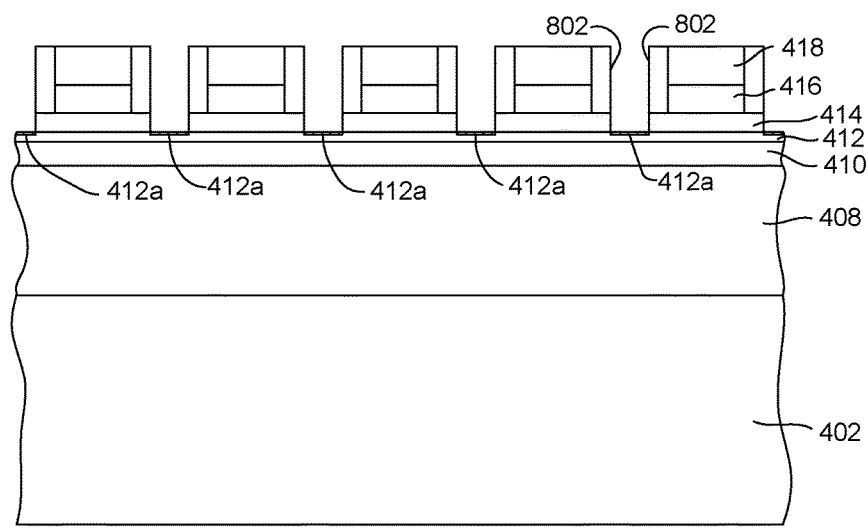
Figure 12:
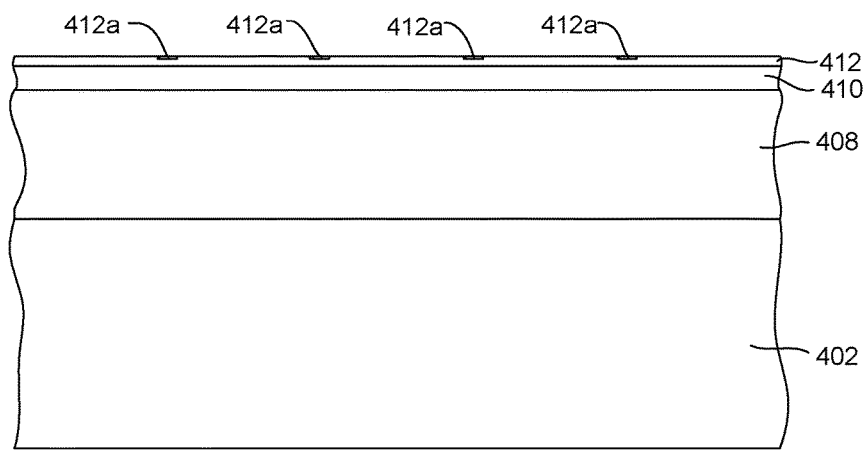

As can be seen in FIG. 10, selected portions of the chemical template layer 412 (brush or mat layer) are exposed through the openings formed by the etching process. A quick plasma exposure is then performed to chemically alter the exposed portions of the chemical template layer 412, forming chemically treated regions 412a in the chemical template layer 412 as shown in FIG. 10. Then, a suitable solvent is used to dissolve and remove the soluble polymer layer 414, thereby also removing the layers 416, 418, 802 above the soluble polymer layer 414, leaving a structure as shown in FIG. 11. Since the chemical template layer 412 was previously patterned by plasma exposure, it is necessary that the patterning of the chemical template layer 412 not be affected or damaged by further plasma exposure. The use of solvent liftoff to remove the soluble polymer material 412 advantageously removes all of the layers above the chemical template layer 412 without chemically affecting the chemical template layer and without damaging the previous chemical patterning of the chemical template layer 412.

Figure 13:
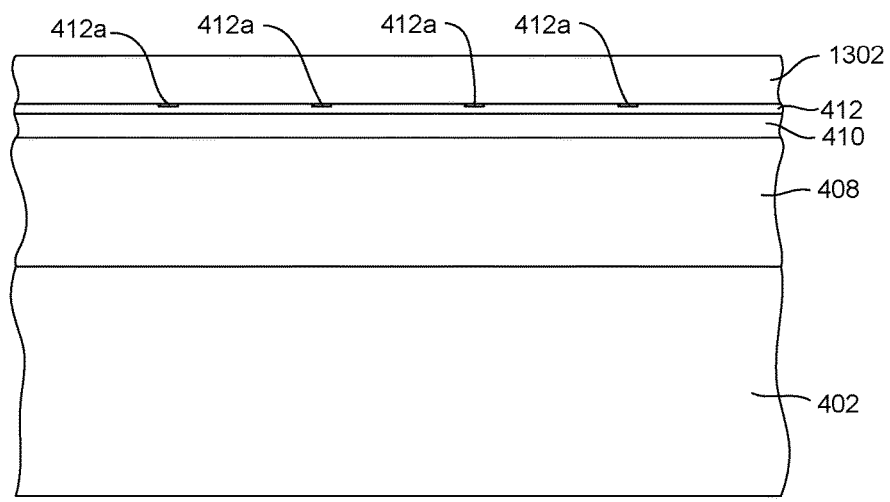

With reference now to FIG. 13, a block copolymer material 1302 is deposited over the patterned brush layer 412. The block copolymer material 1302 can be a material such as polystyrene-b-polymethylmethacrylate. As previously mentioned, the previously formed photoresist mask 418 (FIGS. 5 and 6) was patterned with openings having a center to center spacing that is an integer multiple of the block copolymer material 1302 deposited in FIG. 13. Therefore, the chemically patterned regions 412a are also separated by a center to center distance that is an integer multiple of the natural period of the block copolymer material 1302.

Figure 14:
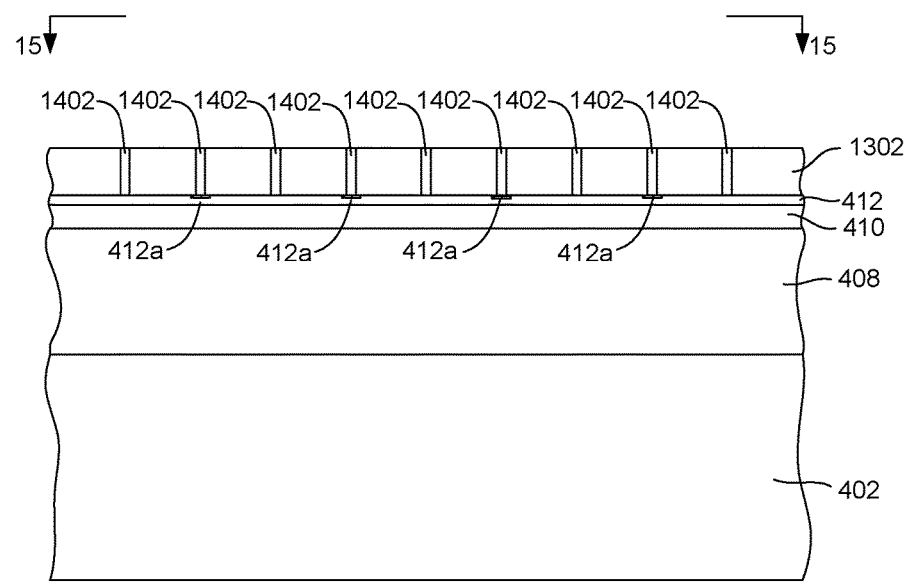

Then, an annealing process is performed to cause the block copolymer material to order itself to form cylindrical pillars 1302a as shown in FIG. 14. The patterned brush layer 412 acts as a chemical template for guiding the ordered formation of the cylindrical pillars 1402. Some of the cylindrical pillars 1402a will form over the chemically patterned regions 412a of the brush layer 412. However, because the patterned regions 412a are spaced apart by a distance that is an integer multiple of the natural period of the block copolymer material 1302, other pillars 1402 will form in an ordered pattern in regions between the patterned regions 412a. In the example, shown in FIG. 14, the patterned regions 412a of the brush layer 412 are patterned at a spacing that is twice the natural period of the block copolymer material 1302. Therefore, there is one extra cylinder 1402 between each of the cylinders 1402a located over the patterned regions 412a. However, other spacings could be used. For example, if the patterned regions 412a are spaced apart by a distance that is three times the natural period of the block copolymer, there would two pillars between each of the pillars 1402a. Similarly, the spacing could be 3 or 4 times the natural period of the block copolymer material 1302, in which case there would be even more cylinders 1402 formed between the patterned regions 412a.

Figure 15:
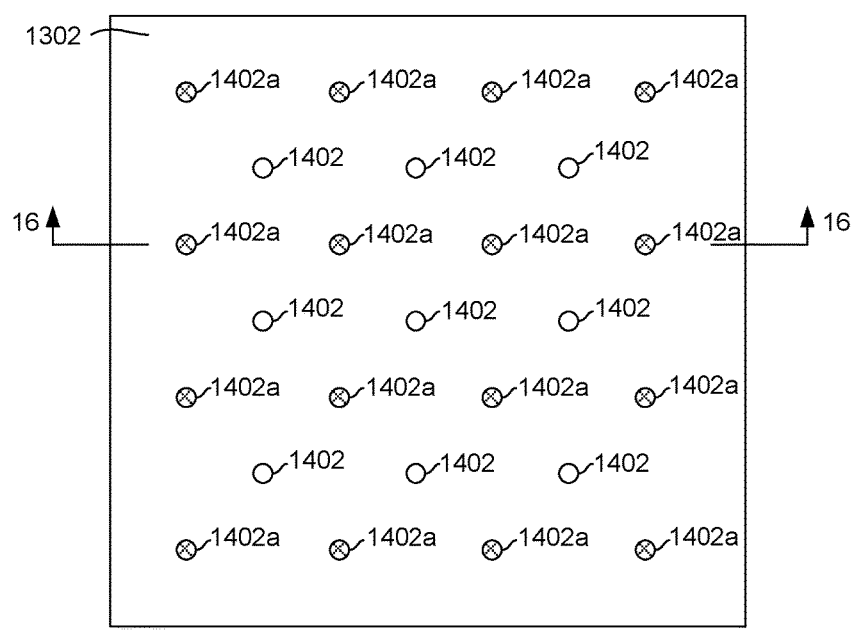

In the example of FIG. 14, the arrangement of pillars 1402 can be better understood with reference to FIG. 15, which shows a top down view as seen from line 15-15 of FIG. 14. In FIG. 15, it can be seen that the pillars 1402 arrange themselves in a hexagonal close packed arrangement. The pillars 1402a that are formed over patterned portions of the brush layer 412 (FIG. 14) are shown in cross-hatch in FIG. 15. The other additional pillars 1402 form between the pillars 1402a. As can be seen, this doubles the number of pillars that can be formed. The spacing between the pillars is limited only by the natural period of the second block co-polymer material 1302 rather than by the physical limits of photolithography. This means that the pitch of the memory array can be greatly reduced below the limits of photolithography.

With the cylindrical pillars 1402 defined as discussed above, the pillars 1402 are converted into etch resistant pillars. This can be accomplished according to at least two possible processes. One way in which this can be accomplished, is through selective metal oxide or semiconductor infusion. In this process the wafer with the block copolymer cylinders 1402 formed thereon is repeatedly exposed to metal infusion followed by oxidation. For example, the wafer and cylinders 1402 can be exposed to a metal vapor, such as tetrammethylalumina (TMA) to infuse aluminum into the cylinders 1402 followed by exposure to water vapor ($H_2O$) to oxidize the infused alumina. The infusion and oxidation processes are repeated a number of times until the cylinders 1402 become etch resistant metal oxide pillars surrounded by a block copolymer matrix. Then, the surrounding block copolymer matrix surrounding the cylinders 1402 can be removed, such as by etching, leaving free standing metal oxide pillars 1402.

Another way in which such etch resistant pillars can be formed is to remove the cylinders 1402 and refill with an etch-resistant material. Starting with a structure such as that shown in FIGS. 14 and 15, the block copolymer material 1302, 1402 can be exposed to ultra-violet light, (UV exposure). This UV exposure cross links the outer block copolymer matrix 1302 and breaks down the cylinders 1402. An etching such as dry or wet etch can then be performed to remove the cylinder 1402, leaving narrow cylindrical holes where the cylinders 1402 were. An etch-resistant material can then be deposited to fill the openings left by the removed cylinders 1402. This can be, for example, a conformal coating of spin on glass such as hydrogen silsesquioxane (HSQ) or deposition of an appropriate oxide, such as by plasma vapor deposition (PVD) or atomic layer deposition ALD. Then, an etching process can be performed to remove the surrounding block copolymer matrix 1302, leaving free standing etch resistant pillars 1402.

Figure 16:
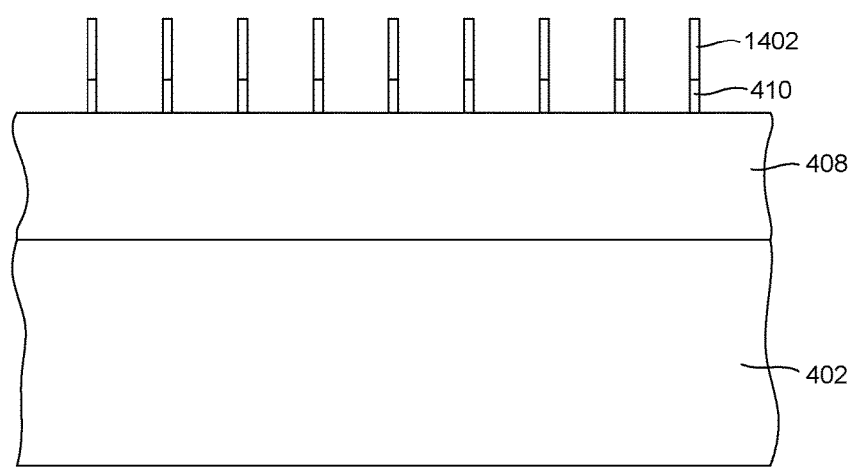

With the free standing etch resistant pillars 1402 thus formed, the image of the etch resistant pillars 1402 can be transferred onto the underlying hard mask material layer 410, leaving a structure such as is shown in side, cross-section in FIG. 16. This can be performed, for example, by performing a reactive ion etching (RIE) in a chemistry that is chosen to selectively remove the material of the hard mask layer 410.

Figure 17:
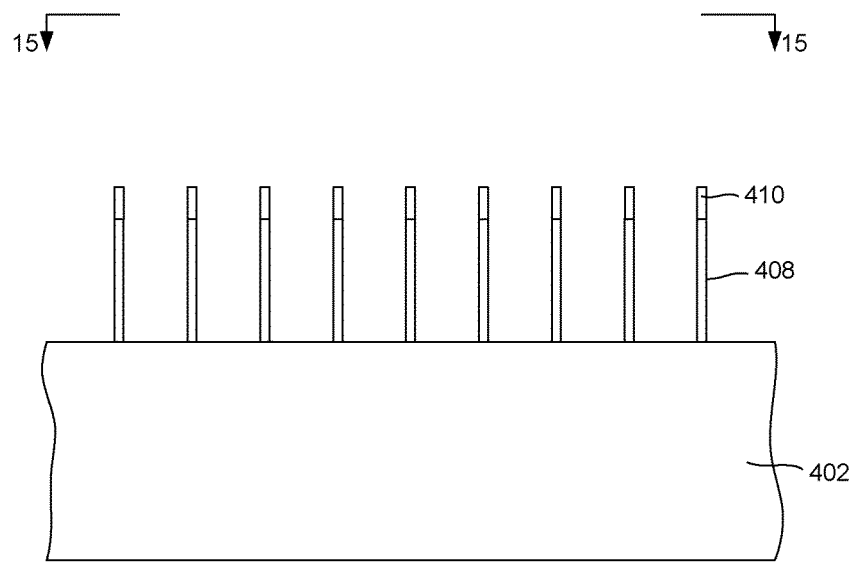

Then, with the hard mask 410 patterned, another material removal process such as ion milling can be performed to remove portions of the magnetic memory material 408 that are not protected by the patterned hard mask 410, leaving a structure such as shown in FIG. 17.

Figure 18:
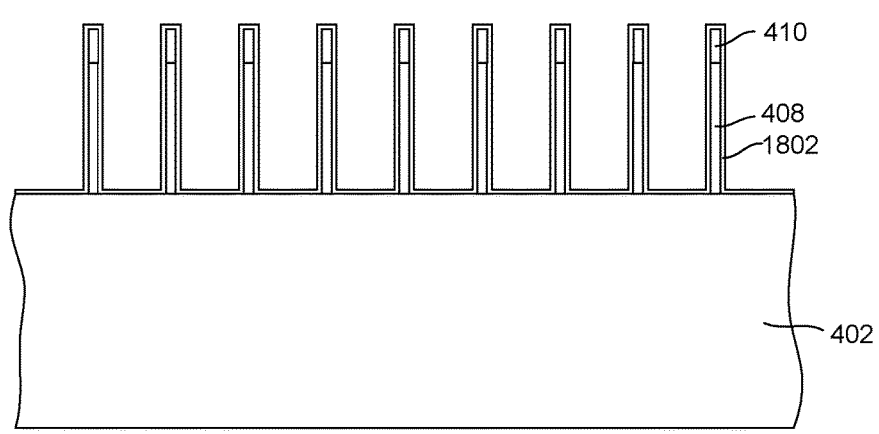
Figure 19:
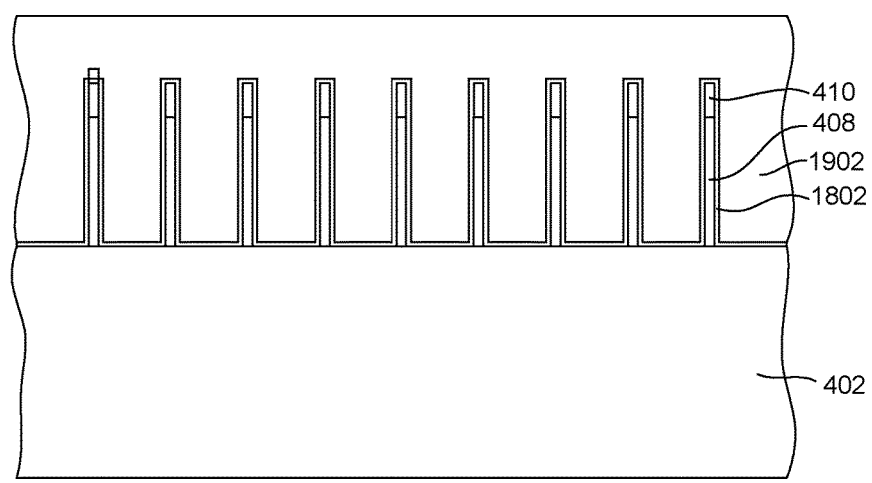

Then, with reference to FIG. 18, a thin passivation layer 1802 is deposited. The passivation layer 1802 can be a thin, electrically insulating layer such as SiN or $SiO_2$, which can be deposited by a conformal deposition process such as atomic layer deposition or chemical vapor deposition. The passivation layer 1802 is preferably deposited in-situ. (e.g. without breaking vacuum). Then, with reference to FIG. 19, an electrically insulating fill layer 1902 is deposited. The electrically insulating fill layer 1902 can be a material such as SiNx or $SiO_2$, and can be deposited by sputter deposition. The passivation layer 1802 protects the memory element pillars 408 during the sputter deposition of the fill layer 1902.

Figure 20:
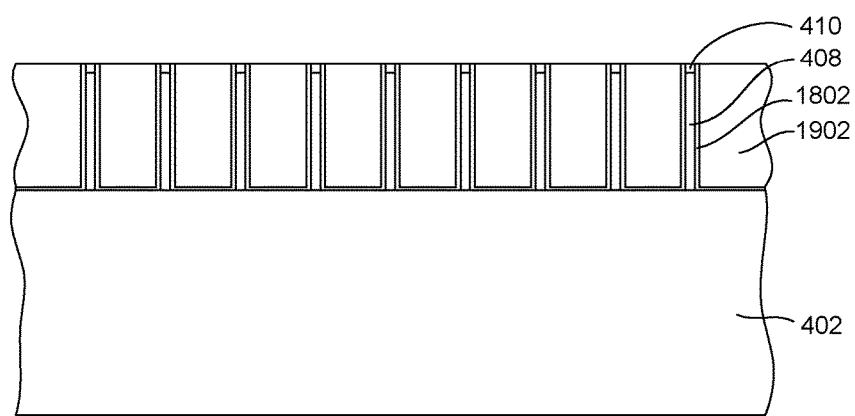
Figure 21:
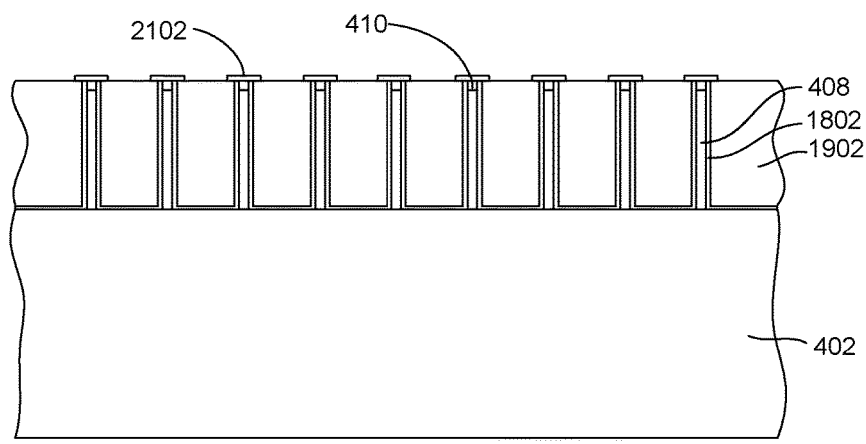

Then, a chemical mechanical polishing process can then be performed to planarize the surface. The chemical mechanical polishing process can be stopped at the hard mask layer 410, leaving a structure as shown in FIG. 20. Electrically conductive electrodes 2102 can then be formed over the memory elements 408, leaving a structure as shown in FIG. 21.

Figure 22:
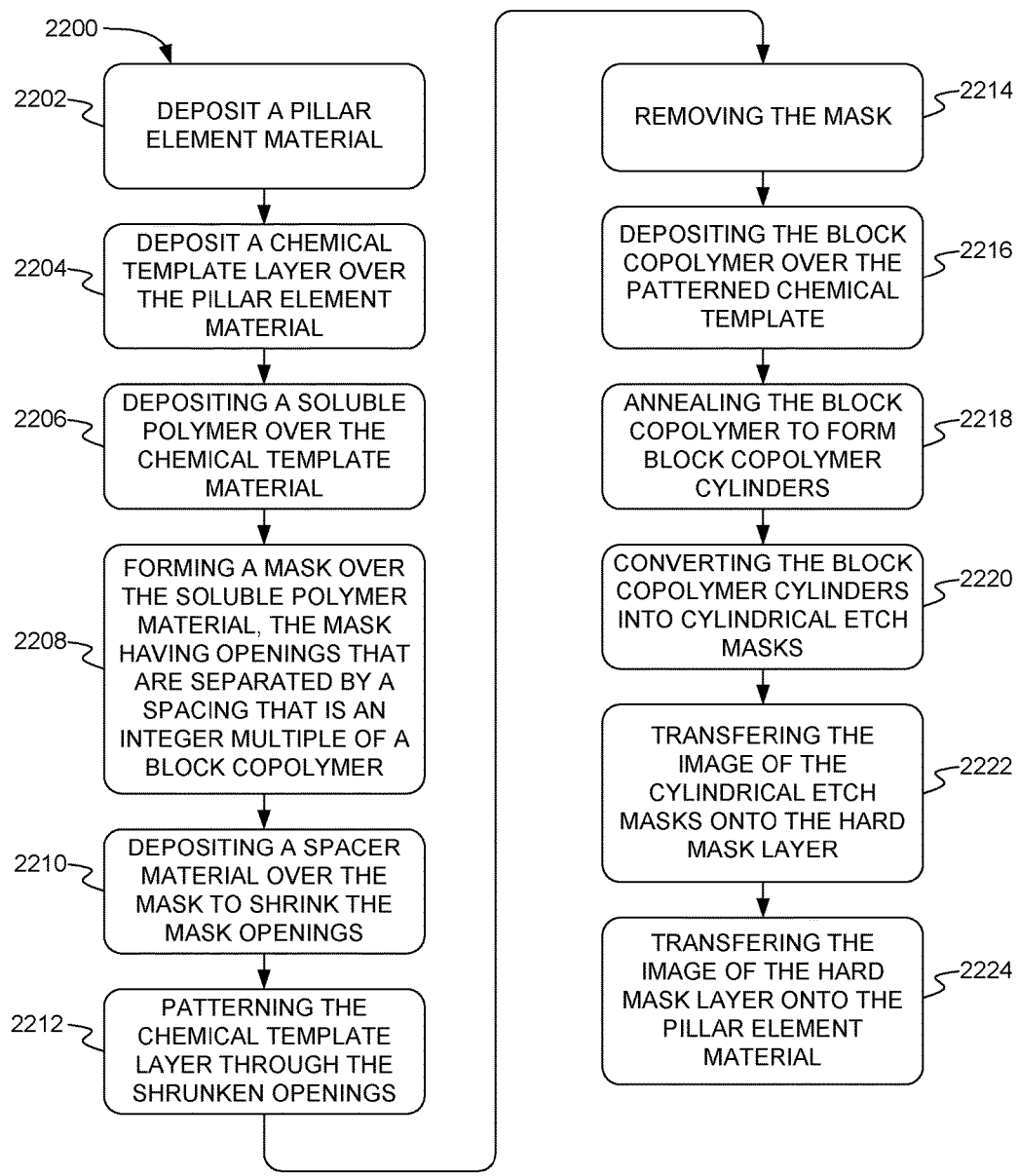
FIG. 22 is a flowchart summarizing a method for manufacturing an array of magnetic memory elements.

The above described process for manufacturing a magnetic memory element array can be summarized with reference to FIG. 22, which is a flowchart illustrating a method 2200 for manufacturing a magnetic memory element array. The method 2200 begins with a step 2202 of depositing a memory element material. The memory element material can be a series of layers making up a magnetic memory element such as a magnetic tunnel junction (MTJ) element. In a step 2204, a chemical template such as a brush or mat layer is deposited over the pillar element material. Then, in step 2206, a soluble polymer such as DURAMIDE® is deposited over the chemical template layer. The soluble polymer material and hard mask can function as an anti-reflective coating, although optional one or more additional anti-reflective coatings may also be deposited over the soluble polymer layer as well.

Then, in a step 2208 a mask is formed over the soluble polymer material. The mask can be a photoresist mask that can be photolithographicaly patterned to have openings that are arranged to have a center to center spacing that is substantially equal to an integer multiple of a block copolymer material that will be deposited and annealed in a later step. Then, in a step 2210, the openings of the mask are shrunk by depositing a spacer material such as SiOx or SiNx over the mask structure. An etching can be performed to open up the bottoms of the space material and portions of the soluble polymer to expose the chemical template layer therebeneath.

Then, in a step 2212, the pattern chemical template layer is patterned through the shrunken openings in the mask structure. The chemical template layer can be patterned by a quick plasma exposure, which alters the chemical structure of the chemical template, but does not remove it. Then, in a step 2214, the mask is removed by using an appropriate solvent to dissolve the soluble polymer, so as not to damage the previously patterned chemical template layer.

Then, in a step 2216, the block copolymer material is deposited over the patterned chemical template. The block copolymer is then annealed in a step 2218. The annealing causes the block copolymer to self assemble into ordered cylinders of block copolymer material surrounded by a block copolymer matrix. The block copolymer cylinders form at patterned locations on the chemical template later, and also at locations between the patterned portions of the chemical template layer. The number of cylinders forming between the patterned portions of the chemical template layer depends on the natural period of the block copolymer relative to the spacing between the patterned portions of the chemical template.

Then, in a step 2220, the block copolymer cylinders are converted into cylindrical etch mask structures. There are multiple ways in which this can be achieved. For example, a metal oxide can be diffused into the block copolymer cylinders by repeated cycles of exposure to a metal vapor to diffuse metal into the block copolymer cylinders and exposure to water vapor to oxide the metal diffused into the block copolymer cylinders. Another way to convert the block copolymer cylinders into etch masks is to expose the block copolymer to UV light to cross link the block copolymer matrix and then remove the cylinders by etching to form cylindrical openings in the block copolymer matrix. An etch resistant material can then be deposited into the openings in the block copolymer matrix. The etch resistant material can be a conformal coating of spin on glass or can be a material deposited by plasma vapor deposition or atomic layer deposition. A top conformal coating will coat the inside of the former cylinders. An etch back step can be performed to remove the material on top of the remaining block copolymer. Then, an etching can be performed to remove the block copolymer matrix, leaving etch resistant cylinders.

Then, in a step 2222 an etching process is performed to transfer the image of the etch resistant cylinders onto the underlying hard mask layer. The etching process can be a reactive ion etching (RIE) performed in a chemistry that is chosen to selectively remove the hard mask material. Then, in a step 2224, the image of the patterned hard mask is transferred to the pillar element material. This can be performed by a process such as reactive ion etching (RIE) or ion milling to remove portions of the pillar element material that are not protected by the hard mask. The ion milling can be performed at one or more angles relative to normal to form well defined vertical side walls with little or no re-deposited material between pillar elements.

As can be seen, the above process results in magnetic memory element pillars that are formed at a density that is much greater than the physical limits of photolithography. In fact, the density can be several times greater than that which would be possible using photolithographic processes. While the above described process is useful for forming memory element pillar arrays, it can also be used to produce arrays of pillar structures for other applications as well.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A method for high density pillar structures, the method comprising:
   depositing a pillar element material;
   depositing a hard mask layer over the pillar element material;
   depositing a chemical template layer over the hard mask layer;
   depositing a soluble polymer over the chemical template layer;
   forming a mask structure over the soluble polymer, the mask having openings that are separated by a spacing that is an integer multiple of a natural period of a block copolymer;
   depositing a spacer layer over the mask structure to shrink the size of the opening in the mask structure;
   performing an etching to remove a portion of the spacer layer and expose a portion of the underlying chemical template layer;
   performing a plasma exposure to chemically pattern the exposed portion of the chemical template layer;
   removing the soluble polymer and layers there-over;
   depositing a block copolymer; and
   annealing the block copolymer to cause the block copolymer to self assemble into cylinders, the cylinders being located over patterned portions of the chemical template layer and also in areas between the patterned portions of the chemical template layer.

2. The method as in claim 1, further comprising after annealing the block copolymer, using the cylinders as mask structures to form an array of pillars from the pillar element material.

3. The method as in claim 1, wherein the pillar element material is a plurality of layers for making a magnetic random access memory element.

4. The method as in claim 1, wherein the spacer material comprises SiOx or SiNx.

5. The method as in claim 1, wherein the block copolymer material comprises polystyrene-b-methylmethacrylate.

6. The method as in claim 1, wherein the etching is an anisotropic etching.

7. The method as in claim 1, wherein forming the mask further comprises:
depositing a photoresist; and
photolithographically patterning the photoresist.

8. The method as in claim 7 further comprising, after annealing the block copolymer:
performing a reactive ion etching to transfer the image of the cylinders onto the underlying hard mask layer; and
performing an ion milling to transfer the image of the hard mask layer onto the pillar element material.

9. The method as in claim 1, further comprising, after annealing the block copolymer:
converting the cylinders into cylindrical etch mask structures;
performing a reactive ion etching to transfer the image of the cylindrical etch mask structures onto the underlying hard mask layer to form a patterned hard mask structure; and
performing an ion milling to transfer the image of the patterned hard mask structure onto the underlying pillar element layer.

10. The method as in claim 9, wherein converting the cylinders into cylindrical etch mask structures further comprises infusing metal oxide into the cylinders.

11. The method as in claim 9, wherein converting the cylinders into cylindrical etch mask structures further comprises exposing the cylinders to a metal vapor and exposing the cylinders to water vapor.

12. The method as in claim 9, wherein converting the cylinders into cylindrical etch mask structures further comprises removing the cylinders to form cylindrical openings in the block copolymer;
and filling the cylindrical openings with an etch mask material.

13. The method as in claim 9, wherein the cylinders are surrounded by a copolymer matrix, and wherein converting the cylinders into cylindrical etch mask structures further comprises:
performing an ultraviolet light exposure to cross link the copolymer matrix and break down the cylinders;
perform an etching to remove the cylinders, leaving cylindrical openings in the block copolymer matrix;
depositing an etch mask material into the cylindrical openings in the block copolymer matrix; and
performing an etching to remove the block copolymer matrix.

14. The method as in claim 13, wherein depositing an etch mask material into the cylindrical openings in the block copolymer material further comprises coating with spin on glass.

15. The method as in claim 13, wherein the etch mask material is deposited by one or more of plasma vapor deposition and atomic layer deposition.

16. A method for manufacturing a high density array of magnetic memory elements, the method comprising:
depositing a memory element material;
depositing a chemical template material over the memory element material;
forming a mask structure over the chemical template material, the mask structure having openings with a center to center spacing that is substantially equal to a natural period of a block copolymer;
shrinking the openings in the mask structure;
patterning the chemical template layer;
depositing a block copolymer over the patterned chemical template layer; and
annealing block copolymer to form block copolymer cylinders over the patterned regions of the patterned chemical template and between patterned regions of the patterned chemical template.

17. The method as in claim 16, further comprising converting the block copolymer cylinders into cylindrical etch resistant mask structures.

18. The method as in claim 16, further comprising exposing the block copolymer cylinders to a metal vapor and a water vapor.

19. The method as in claim 16 further comprising repeatedly exposing the block copolymer cylinders to metal vapor and water vapor.

20. The method as in claim 16 further wherein the block copolymer cylinders are surrounded by a block copolymer matrix and further comprising:
removing the block copolymer cylinders, leaving cylindrical openings in the block copolymer matrix; and
depositing an etch resistant material into the cylindrical openings in the block copolymer matrix.

* * * * *